United States Patent [19]

Cox

[11] Patent Number: 5,327,024
[45] Date of Patent: Jul. 5, 1994

[54] FIELD PROGRAMMABLE ANTIFUSE DEVICE AND PROGRAMMING METHOD THEREFOR

[75] Inventor: William D. Cox, Milpitas, Calif.

[73] Assignee: QuickLogic Corporation, Santa Clara, Calif.

[21] Appl. No.: 907,904

[22] Filed: Jul. 2, 1992

[51] Int. Cl.$^5$ ............................................. H03K 19/177
[52] U.S. Cl. ................................. 307/465; 307/202.1; 307/443; 257/530
[58] Field of Search ...................... 307/202.1, 443, 465; 257/530

[56] References Cited

U.S. PATENT DOCUMENTS

| | | |
|---|---|---|
| 4,595,875 | 6/1986 | Chan et al. . |
| 4,651,409 | 3/1987 | Ellsworth et al. . |
| 4,698,589 | 10/1987 | Blankenship et al. . |
| 4,748,490 | 5/1988 | Hollingsworth ................. 257/764 X |
| 4,758,745 | 7/1988 | El Gamal et al. . |
| 4,783,763 | 11/1988 | Bergman . |
| 4,823,181 | 4/1989 | Mohsen et al. . |
| 4,857,774 | 8/1989 | El-Ayat et al. . |
| 4,873,459 | 10/1989 | El Gamal et al. . |
| 4,910,417 | 3/1990 | El Gamal et al. . |
| 4,933,898 | 6/1990 | Gilberg et al. . |
| 4,969,124 | 11/1990 | Luich et al. . |
| 5,008,855 | 4/1991 | Eltoukhy et al. . |
| 5,070,384 | 12/1991 | McCollum et al. . |
| 5,126,282 | 6/1992 | Chiang et al. . |
| 5,130,777 | 7/1992 | Galbraith et al. . |
| 5,140,554 | 8/1992 | Schreck et al. . |
| 5,166,556 | 11/1992 | Hsu et al. ........................... 307/465 |
| 5,187,393 | 2/1993 | El Gamal et al. .............. 307/465 X |
| 5,194,759 | 3/1993 | El-Ayat et al. .................. 307/465 X |
| 5,196,724 | 3/1993 | Gordon et al. .................. 257/530 |

FOREIGN PATENT DOCUMENTS 0416903 3/1991 European Pat. Off. .

OTHER PUBLICATIONS

QuickLogic Preliminary Data Sheet: "pASIC TM 1 Family ViaLink TM Technology Very High Speed CMOS FPGAs", May 1991, pp. 1-32.

QuickLogic Data Sheet: "An Introduction to QuickLogic's pASIC Devices and SpDE Development Environment", Apr. 1991, pp. 1-12.

(List continued on next page.)

*Primary Examiner*—David R. Hudspeth
*Attorney, Agent, or Firm*—Skjerven, Morrill, MacPherson, Franklin & Friel

[57] ABSTRACT

A method for reducing the resistance of a programming path through a programmable antifuse from a programming voltage to ground. A previously programmed helper antifuse connected somewhere along a two branch programming path is connected to either the programming voltage or to ground. As a result, a three branch programming path is established from the programming voltage to the antifuse to be programmed and from the antifuse to be programmed to ground. By adding the third branch to the programming path, the resistance of the programming path is reduced, thereby allowing a higher voltage to be dropped across the antifuse to be programmed during programming and thereby allowing increased current flow through the antifuse to be programmed during programming. In another embodiment, two or more helper antifuses are used to establish a four or more branch programming path having a still lower resistance from the programming voltage to ground. In yet another embodiment, the programming of antifuses occurs in two steps. First, multiple antifuses are partially programmed separately. Second, these partially programmed antifuses are connected together in series so that a programming current can flow through all of the partially programmed antifuses at once to complete programming of the multiple antifuses.

16 Claims, 6 Drawing Sheets

OTHER PUBLICATIONS

J. Birkner et al., "A Very High-Speed Field Programmable Gate Array Using Metal-To-Metal Antifuse Programmable Elements", IEEE 1991, Custom Integrated Circuits Conference, Session 1, May 12, 1991, 8 pages.

QuickLogic, "pASIC Toolkit User's Guide" Revision 1.0, Jun. 1991.

E. Hamdy, et al., "Dielectric Based Antifuse for Logic and Memory ICs", IEEE 1988, 786–IEDM 88, 4 pages.

Liu, D. et al., "Scaled Dielectric Antifuse Structure for Field-Programmable Gate Array Applications", IEEE Electron Device Letter, vol. 12, No. 4, Apr. 1991, pp. 151–153.

Yau, L., "Determination of the Fowler-Nordheim Tunneling Barrier from Nitride to Oxide in Oxide: Nitride Dual Dielectric", IEEE Electron Device Letters, vol. EDL-7, No. 6, Jun. 1986, pp. 365–367.

Chiang et al., "Oxide-Nitride-Oxide Antifuse Reliability", IEEE; Cat. No. 90CH2787-0, 1990, pp. 186–192.

Cook, B., et al., "Amorphous Silicon Antifuse Technology For Bipolar PROMs", 1986 Bipolar Circuits and Technology Meeting, IEEE 1986, pp. 99–100.

FIELD PROGRAMMABLE ANTIFUSE DEVICE AND PROGRAMMING METHOD THEREFOR

FIELD OF THE INVENTION

This invention relates to field programmable devices and methods of programming antifuses in field programmable devices.

BACKGROUND INFORMATION

A field programmable device (or a so-called "field programmable gate array") is a versatile integrated circuit chip, the internal circuitry of which may be configured by an individual user to realize a user-specific circuit. To configure a field programmable device, the user configures an on-chip interconnect structure of the field programmable device so that selected inputs and selected outputs of selected on-chip logic components are connected together in such a way that the resulting circuit is the user-specific circuit desired by the user.

Figure 1A:
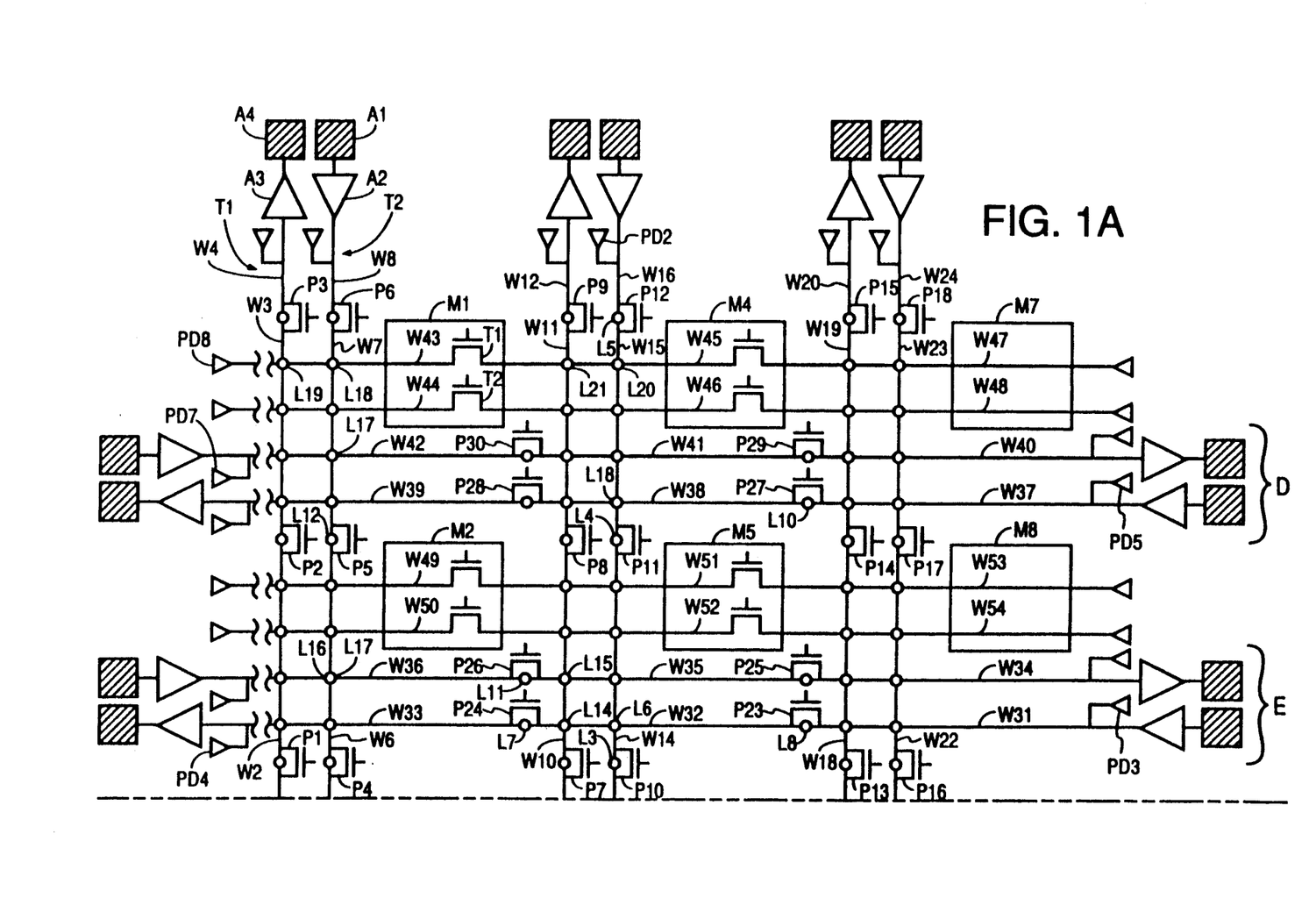
Figure 1B:
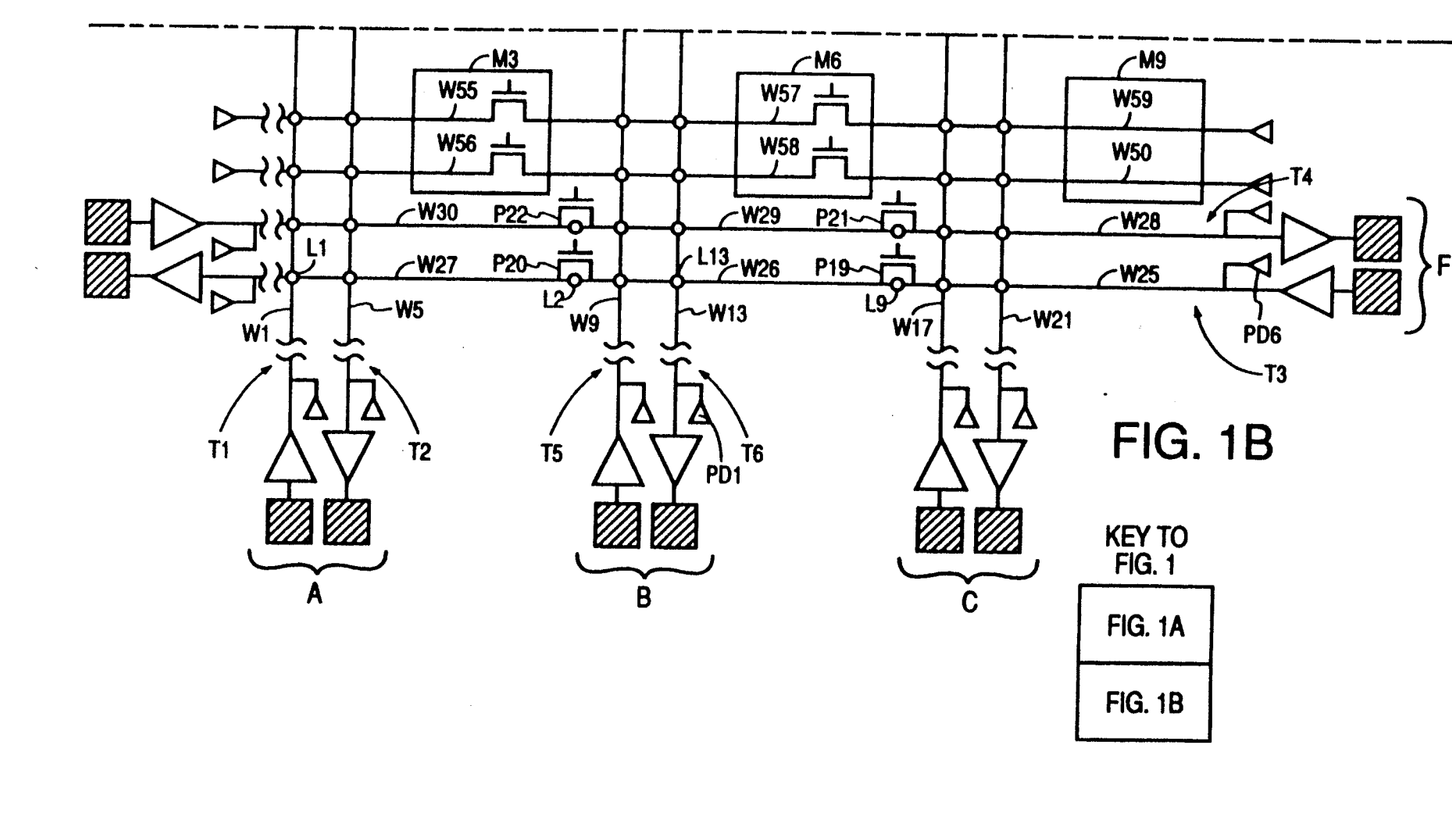

FIG. 1A–1B is a top down simplified diagram illustrating a corner portion of a field programmable device. Three vertical routing channels A–C and three horizontal routing channels D–F separate nine universal logic modules M1–M9. These nine logic modules are arranged in a three-by-three matrix. Each logic module may, for example, comprise logic components such as digital logic gates, digital sequential logic circuitry, and other circuitry.

In the vertical dimension, routing channel A, for example, comprises two tracks T1 and T2. Track T1, for example, comprises wires W1, W2, W3, and W4. A transistor P1, called a pass transistor, is connected between wires W1 and W2. A second pass transistor P2 is connected between wires W2 and W3. A third pass transistor P3 is connected between wires W3 and W4. The other illustrated wires W5–W24 and the other illustrated pass transistors P4–P18 of the vertical tracks of FIG. 1A–1B are similarly numbered.

In the horizontal dimension, routing channel F, for example, comprises two tracks T3 an T4. Track T3, for example, comprises wires W25, W26, and W27. A pass transistor P19 is connected between wires W25 and W26. A pass transistor P20 is connected between wires W26 and W27. The other illustrated wires W28–W42 and the other illustrated pass transistors P21–P30 of the horizontal tracks of FIG. 1A–1B are similarly numbered.

Each of the small circles in FIG. 1A–1B represents an unprogrammed connection element referred to as a programmable "antifuse". In contrast to typical fuses used in programmable read-only memory (PROM) devices which are normally conductive and are "blown" to be nonconductive, antifuses are normally nonconductive and can be "programmed" to be conductive.

Due to the large number of antifuses in the structure represented by FIG. 1A–1B, only certain of the antifuses are supplied with reference numerals. Some of the antifuses, called "cross antifuses", are located substantially at the cross points of horizontal and vertical wires. These cross antifuses can be programmed to connect a horizontal wire with a vertical wire.

Figure 2:
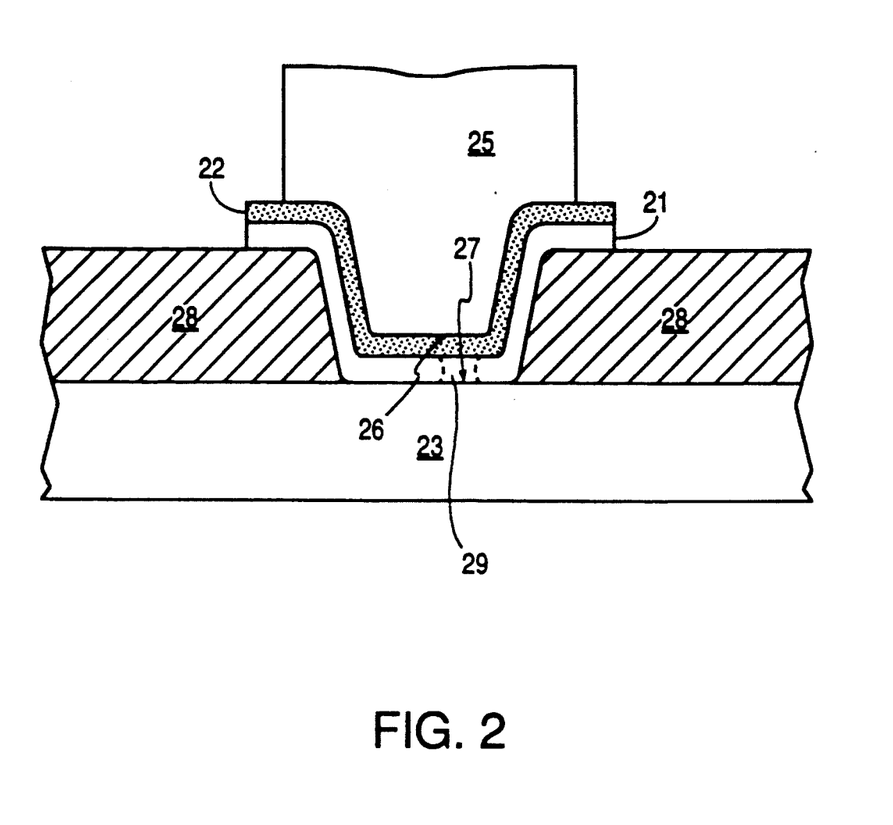
FIG. 2 is a cross sectional view of one possible embodiment of an cross antifuse.

FIG. 2 is a cross sectional view of one possible embodiment of a cross antifuse. Cross antifuse 20 comprises a thin dielectric body layer 21 and a layer of diffusible conductive material 22 sandwiched between horizontal wire 23 and vertical wire 25 so that a first surface portion 26 of the antifuse contacts vertical wire 25 and so that a second surface portion contacts horizontal wire 23. The horizontal wire 23 may, for example, be located on a first metallization layer of the programmable device whereas the vertical wire 25 may be located on a second metallization layer of the programmable device. An insulating layer 28 may be disposed between the first metallization layer and the second metallization layer so that the cross antifuse forms a via-like structure from the vertical wire 25 down to the horizontal wire 23. In its unprogrammed state, horizontal wire 23 is insulated from vertical wire 25 by dielectric body layer 21. In its programmed state, a conductive path 29 is formed through body layer 21 so that horizontal wire 23 and vertical wire 25 are substantially electrically connected. One such cross antifuse L1 is disposed between and vertical wire W1 and a horizontal wire W27 in the circuit of FIG. 1A–1B.

Other of the antifuses, called "pass antifuses", may be programmed to electrically connect the source and drain of a pass transistor together so that two adjacent wires in a single track are connected together in series independent of the state of the pass transistor. One such pass antifuse which may be programmed to connect horizontal wire W26 to horizontal wire W27 is pass antifuse L2.

The field programmable device of FIG. 1A–1B also has input/output circuitry for interfacing the user-defined circuit of the interconnected logic modules to other circuitry off-chip. A signal originating from off-chip may, for example, be input onto vertical wire W8 via I/O pad A1 and input I/O buffer A2. A signal on vertical wire W4 generated on-chip may, for example, be output to circuitry off-chip via output I/O buffer A3 and output I/O pad A4.

Each of the modules M1–M9 has digital signal input wires and digital signal output wires. Module M1, for example, has a single digital signal input wire W43 entering module M1 from the left and a single digital signal output wire W44 exiting module M1 to the left. Module M4 has an input wire W45 and an output wire W46. Although the modules in the device of FIGS. 1A–1B each have only one input wire and one output wire, each module of an actual device may have a great number of digital signal wires. To connect these digital signal input and output wires to the rest of the interconnect circuitry, cross antifuses are provided on each digital signal input wire and each digital signal output wire where the input or output wire crosses a vertical wire. Input wire W43, for example, has two cross antifuses L18 and L19. Input wire W45 has two cross antifuses L20 and L21. Transistors, such as transistor T1, are provided to connect adjacent ones of these digital signal wires together during programming of cross antifuses.

Although FIG. 1A–1B shows wires W1, W5, W9, W13, W17 and W21 as single wires connected between I/O buffers and cross antifuses, additional rows of logic modules and associated horizontal routing channels are disposed between the bottom row of cross antifuses and the bottom row of I/O buffers and I/O pads. Similarly, additional columns of logic modules and associated vertical routing channels are disposed between the leftmost column of cross antifuses and the leftmost column of I/O buffers and I/O pads. The structure of FIG. 1A–1B is therefore a simplified representation of an upper right corner portion of a larger field programmable device.

To realize a desired circuit from the unprogrammed structure of FIG. 1A–1B, selected antifuses in the structure are programmed so that various of the wires W1–W60 are connected together to form an interconnect net from one specific output of a specific digital logic component in a module to one or more specific inputs of other specific digital logic components in another module. The antifuses in FIG. 1A–1B are programmed when a high programming voltage (Vpp) having a magnitude greater that the normal operating voltage supply of the programmable device is placed across the antifuse. If, for example, the normal operating voltage is approximately 5 volts plus or minus 10 percent, placing a programming voltage Vpp of having a magnitude greater than approximately 11 volts across an antifuse will cause the antifuse to become to become conductive. Unprogrammed antifuses may have a conductivity of approximately 1–50 gigaohms or more whereas programmed antifuses may have a conductivity of approximately 50 ohms or less.

Figure 3:
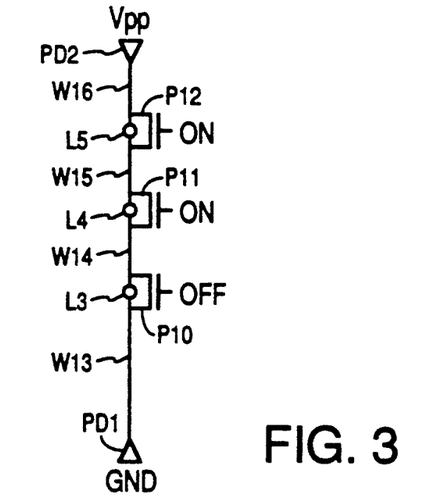
FIG. 3 shows the programming of a pass antifuse in the field programmable device of FIG. 1A-1B.

FIG. 3 shows the programming of a pass antifuse L3 in the field programmable device of FIG. 1A–1B. In the circuit shown in FIG. 1A–1B, each end of track T6 has a programming driver. Programming driver PD1 is connected to vertical wire W13 and programming driver PD2 is connected to vertical wire W16. These programming drivers have tri-state outputs so that they can be disconnected from wires W13 and W16 during normal circuit operation. During the programming of antifuses, however, these programming drivers may be controlled to output a programming voltage (Vpp), or may be controlled to output a ground voltage.

In the example shown in FIG. 3, pass antifuse L3 is to be programmed. Pass transistors P12 and P11 are turned on whereas pass transistor P10 is not turned on. Programming driver PD2 is controlled to drive vertical wire W16 with the programming voltage Vpp and programming driver PD1 is controlled to drive wire W13 with a ground voltage. Because pass transistors P12 and P11 are turned on and pass transistor P10 is turned off, programming voltage Vpp propagates to wire W15 and then to wire W14. A significant portion of programming voltage Vpp is therefore dropped between wire W14 and wire W13 across pass antifuse L3. Consequently, antifuse L3 is programmed. Antifuses L4 and L5 are not programmed because conductive pass transistors P11 and P12 prevent a large voltage from developing across antifuses L4 and L5 respectively. Antifuse L3, on the other hand, is programmed because pass transistor P10 is not conductive and does not prevent the programming voltage from developing across antifuse L3. The path from Vpp to antifuse L3 to be programmed and from antifuse L3 to ground is called a programming path. This programming path only comprises two branches. One branch extends from programming driver PD2 to a first surface portion of the antifuse to be programmed L3. A second branch extends from a second portion of the antifuse to be programmed L3 to programming driver PD1. Programming of antifuse L3 causes the first surface portion of antifuse L3 to be permanently electrically connected to the second surface portion of antifuse L3.

Figure 4:
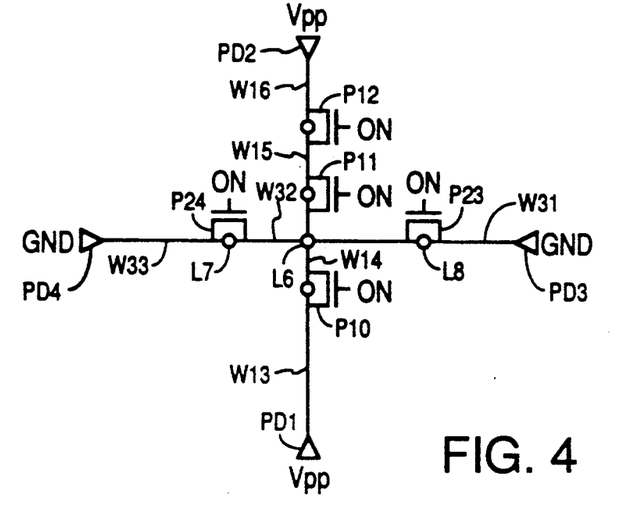
FIG. 4 shows the programming of cross antifuse in the field programmable device of FIG. 1A-1B.

FIG. 4 shows the programming of cross antifuse L6 in the field programmable device of FIG. 1A–1B. In this case, both programming drivers PD1 and PD2 may be set to output the programming voltage Vpp. Because pass transistors P10–P12 are turned on, vertical wire W14 is driven with the programming voltage Vpp. To create a voltage drop across cross antifuse L6, horizontal wire W32 is driven to the ground voltage. Accordingly, programming driver PD4 is set to drive horizontal wire W33 to ground and programming driver PD3 is set to drive horizontal wire W31 to ground. By turning pass transistors P24 and P23 on, horizontal wire W32 is driven with the ground voltage, thereby placing a significant portion of programming voltage Vpp across cross antifuse L6 and thereby programming cross antifuse L6.

The programming path shown in FIG. 4 comprises four programming branches. A first programming branch extends from programming driver PD2, through wire W16, through conductive transistor P12, through wire W15, through conductive transistor P11, through wire W14, and to a first surface portion of the antifuse L6 to be programmed. A second programming branch extends from programming driver PD1, through wire W13, through conductive transistor P10, through wire W14 and to the first surface portion of antifuse L6 to be programmed. A third programming branch extends from programming driver PD3, through wire W31, through pass transistor P23, through wire W3,2 and to a second surface portion of antifuse L6 to be programmed. A fourth programming branch extends from programming driver PD4, through wire W33, through pass transistor P24, through wire W32, and to the second surface portion of antifuse L6 to be programmed. Before antifuse L6 is programmed, the first surface portion of antifuse L6 is insulated from the second surface portion of antifuse L6. After programming the first surface portion of antifuse L6 is substantially electrically connected to the second surface portion of antifuse L6.

Although the above described programming of cross antifuses and pass antifuses may be satisfactory in certain applications, the resistances of the resulting programmed antifuses may often be higher than desired. In the design of large high speed circuits, for example, the resistance of a net determines in part the speed at which a given driver circuit can drive the net from one digital logic voltage level to the other digital logic voltage level. The resistance of the net therefore in part determines the switching speed of the circuit. When long nets are made by connecting multiple wires together using multiple connecting antifuses, the series resistances of the multiple antifuses of the net add together to result in a significant total net resistance. Accordingly, the switching speed of the net is degraded.

In some types of recently developed programmable antifuses, the resistance of a resulting programmed antifuse is a function of the magnitude of the programming current which flows through the antifuse from the first surface portion of the antifuse to the second surface portion of the antifuse during programming and also the time that this programming current flows through the antifuse during programming. In general, an antifuse programmed by dropping the full programming voltage Vpp between the first and second surface portions of the antifuse will have a lower resultant programmed resistance than that same antifuse programmed by dropping a smaller voltage between the first and second surface portions.

In the circuit of FIG. 3, the full programming voltage Vpp is not dropped across antifuse L3 to be programmed. A resistance exists in the two branch programming path from Vpp to antifuse L3 and from antifuse L3 to ground. This resistance causes a voltage drop which reduces the voltage dropped across antifuse L3 and reduces the current flowing through antifuse L3 during programming. The bulk of this programming path resistance is due to the on-resistance of pass transistors P11 and P12. Similarly in the circuit of FIG. 4, although a larger portion of programming voltage Vpp is dropped across cross antifuse L6 during programming, the voltage drop across cross antifuse L6 is still less than Vpp. A resistance does exists in the four branch programming path from Vpp to antifuse L6 and from antifuse L6 to ground. This programming path resistance therefore serves to reduce the magnitude of the voltage dropped across the antifuse L6 during programming.

SUMMARY OF THE INVENTION

The present invention provides a method for reducing the resistance of a programming path between a programming voltage Vpp and ground during the programming of a programmable antifuse using the programming path. According to one embodiment of the present invention, a previously programmed antifuse connected to a branch of a programming path is connected to either Vpp or to ground to reduce the resistance of the programming path. The result is an enlargement of the programming path by the addition of another branch so that the enlarged programming path has a smaller total programming path resistance.

In another embodiment of the present invention, multiple programmed antifuses connected to a programming path are each connected via new branches to either Vpp or ground. The result is an even greater enlargement of the programming path by the addition of two or more programming branches so that the enlarged programming path has a still smaller programming path resistance.

In yet another embodiment of the present invention, the programming of antifuses occurs in two steps. First, multiple programmable antifuses are individually programmed. Second, after the multiple antifuses have been separately programmed, these antifuses are connected together in series between a programming voltage Vpp and ground to form part of a current path. A programming current therefore flows through all of these seriesconnected programmed antifuses at once to program the series-connected antifuses still further.

This series programming embodiment may be used to reduce the time required to program a field programmable device. In the first step, for example, each antifuse may be only partially programmed for a small programming time. Accordingly, in the second step, the programming of multiple partially programmed antifuses can be completed at once by connecting these partially programmed antifuses in series and then by running a programming current from Vpp to ground through the multiple partially programmed antifuses.

BRIEF DESCRIPTION OF THE DRAWINGS

FIG. 1A-1B is a top down simplified diagram illustrating a corner portion of a large field programmable device.

DETAILED DESCRIPTION OF THE INVENTION

Figure 5:
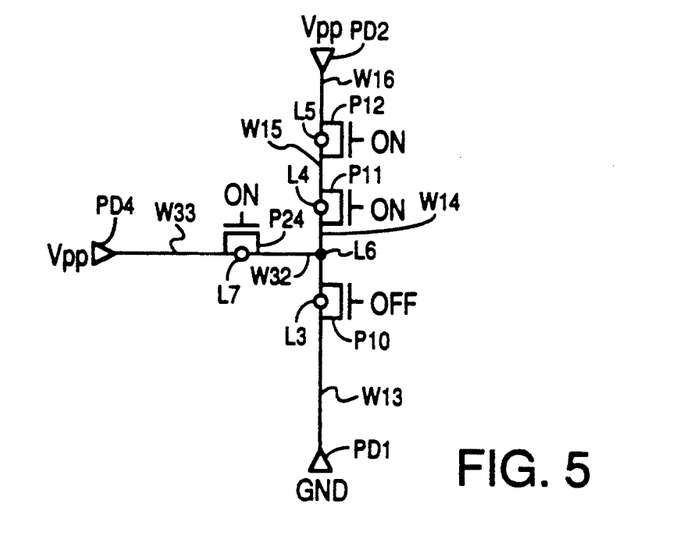
FIG. 5 shows an example of the programming of a pass antifuse according to one embodiment of the present invention.

FIG. 5 shows an example of the programming of a pass antifuse according to one embodiment of the present invention. In this example, pass antifuse L3 is to be programmed and antifuse L4, L5 and L7 are not to be programmed. Vertical wire W16, conductive pass transistor P12, wire W15, conductive pass transistor P11, wire W14, and wire W13 comprise a two branch programming path from Vpp to the antifuse to be programmed, pass antifuse L3 and from the antifuse L3 to be programmed to ground. Pass transistor P10 is turned off so that a programming voltage can develop between a first surface portion of antifuse L3 and a second surface portion of antifuse L3. A previously programmed or partially programmed cross antifuse L6, called a "helper antifuse", exists along the branch from programming driver PD2 to antifuse L3. Helper antifuse L6 is illustrated as a solid dot to indicate that it has been previously programmed. Because wire W14 is to be driven with a voltage as close to Vpp as possible in order to drop the maximum programming voltage across pass antifuse L3, programming driver PD4 is controlled to output the programming voltage Vpp onto horizontal wire W33. By turning pass transistor P24 on, unprogrammed pass antifuse L7 can remain unprogrammed while cross antifuse L6 is connected to the programming voltage output by programming driver PD4. As a result, a two branch programming path is formed between antifuse L3 and Vpp. The resulting resistance between antifuse L3 and Vpp is therefore reduced.

Figure 6:
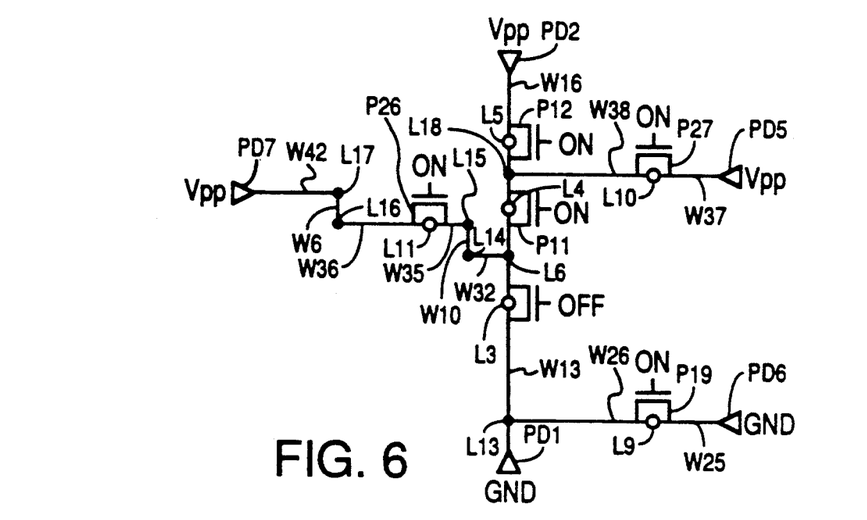
FIG. 6 shows an example of the programming of a pass antifuse according to another embodiment of the present invention.

FIG. 6 shows an example of the programming of a pass antifuse according to another embodiment of the present invention. In this example, pass antifuse L3 is to be programmed. Rather than only a single helper antifuse being employed to create a programming path with a reduced resistance, three helper antifuses L13, L6 and L18 are used in the example of FIG. 6. It is to be understood, however, that any suitable number of helper antifuses can be used according to the present invention. Helper antifuse L13 is connected to ground programming driver PD6 via horizontal wire W26, conductive pass transistor P19, and horizontal wire W25. Helper antifuse L6 is connected to programming voltage programming driver PD7 via horizontal wire W32, previously programmed cross antifuse L14, vertical wire W10, previously programmed cross antifuse L15, horizontal wire W35, conductive pass transistor P26, horizontal wire W36, previously programmed cross antifuse L16, vertical wire W6, previously programmed cross antifuse L17, and horizontal wire W42. This connection of helper antifuse L6 to Vpp evidences that a complex branch comprising several wires, preprogrammed antifuses and pass transistors can be used to connect a helper antifuse to either Vpp or to ground. Helper antifuse L18 is connected to programming voltage Vpp via horizontal wire W38, conductive pass transistor P27 and horizontal wire W37. Although it is not shown in FIG. 6, one or more preprogrammed pass antifuses may also be used rather than or in addition to pass gates to connect wires of a single track in series to form part of a programming branch from a helper antifuse to either Vpp or to ground.

Figure 7:
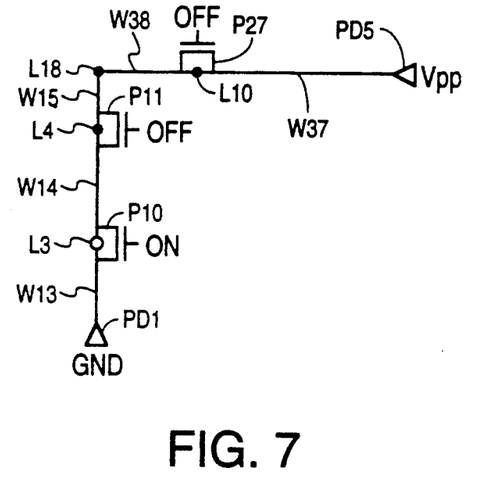
FIG. 7 shows an example of the series programming of antifuses according to still another embodiment of the present invention.

FIG. 7 shows an example of series programming antifuses according to still another embodiment of the present invention. In FIG. 7, three antifuses, pass antifuse L4, cross antifuse L18, and pass antifuse L10 are each separately partially programmed. After being partially programmed, antifuses L4, L18 and L10 are connected together in series to form a current path between Vpp and ground. In FIG. 7, the programming path extends from the programming voltage Vpp at programming driver PD5, through horizontal wire W37, through horizontal wire W38, through vertical wire W15, through vertical wire W14, through conductive pass transistor P10, through vertical wire W13, and to ground at programming driver PD1. Pass transistor P10 is made conductive to prevent pass antifuse L3 from being programmed. Partially programmed antifuses L10, L18 and L4 are not considered to be part of the programming path itself because they are the antifuses being programmed. By initially partially programming multiple antifuses and by subsequently running current through all of these partially programmed antifuses at once, the programming of the multiple antifuses can be accomplished in less time than would otherwise be required if the multiple antifuses were each completely programmed one at a time.

Figure 8:
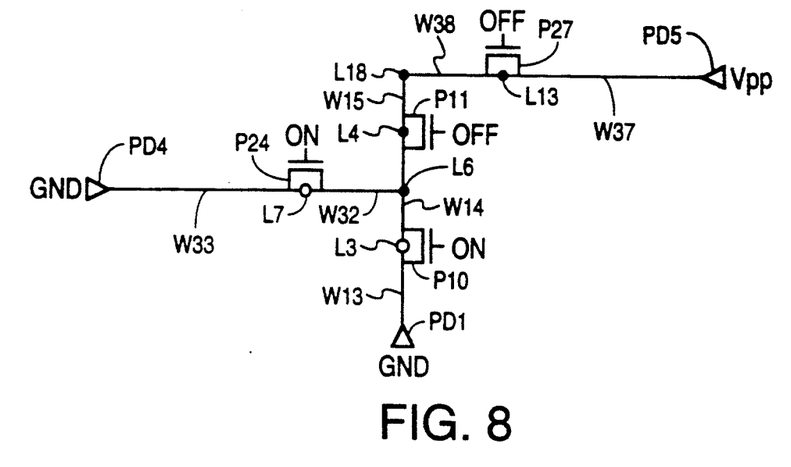
FIG. 8 shows an example of a combination of the embodiment of series programming partially programmed antifuses with the embodiment of using helper antifuses to decrease the resistance of the programming path.

FIG. 8 shows an example of a combination of the series programming of partially programmed antifuses with the use of helper antifuses to decrease the resistance of the programming path. Antifuses L4, L18 and L13 are the partially programmed antifuses being serially programmed. Previously programmed or partially programmed cross antifuse L6 is a helper antifuse which is connected to ground via two different branches of a programming path. Helper antifuse L6 is connected to ground at programming driver PD1 via vertical wire W14, conductive pass transistor P10, and vertical wire W13. Helper antifuse L6 is, however, also connected to ground at programming driver PD4 via horizontal wire W32, conductive pass transistor P24, and horizontal wire W33. Pass antifuses L3 and L7 are not programmed during the programming of antifuses L4, L18, and L13 because pass transistors P10 and P24 prevent programming voltages from developing across antifuses L3 and L7. Due to the two programming branches, the resistance from helper antifuse L6 to ground is lower in the embodiment shown in FIG. 8 than is the resistance from a corresponding location on vertical wire W14 to ground in the embodiment shown in FIG. 7.

Accordingly, the present invention provides a method for driving higher programming currents through antifuses during programming. By driving higher currents through the antifuses, the resulting programmed antifuses have lower resistances and are more reliable. In some embodiments of the invention, programming current is driven through multiple partially programmed series-connected antifuses to reduce device programming time.

According to another aspect of the invention, one or more antifuses called "programming-access antifuses" are programmed along an interconnect net from one specific output of a digital logic component to one or more inputs of other digital logic components. Such a "programming-access antifuse" provides a way for an additional programming branch to be connected to the net during antifuse programming. The additional programming branch or portion of the additional programming branch so connected by the programming-access antifuse is not, however, necessary to conduct signals between digital logic components during normal operation of the net in the final user-specific circuit after antifuse programming. Rather, the programming-access antifuse is programmed to facilitate programming of other antifuses in the net. Antifuse L6 in FIG. 8 may, for example, be such a programming-access antifuse which was programmed to facilitate the programming of other antifuses if horizontal wire W32 is not required in the interconnection net of the final user-specific circuit. Note that pass transistor P24 is made conductive during series programming of antifuses L4, L18 and L13 to prevent pass antifuse L7 from being programmed. If pass transistor L7 is left unprogrammed in the final user-specific circuit after all antifuses which are to be programmed are programmed, then connecting wire W32 to the net would not be necessary to conduct signals between digital logic components during normal circuit operation and antifuse L6 would be a programming-access antifuse.

Although certain specific exemplary embodiments have been described in order to illustrate the invention, the invention is not to be considered limited to the above described specific embodiments. Numerous complex programming paths of vertical and horizontal wires can be devised using either fully programmed antifuses, partially programmed antifuses, or combinations thereof to perform either serial programming or to increase the current flowing through an antifuse during programming. It is to be understood that the vertical and horizontal orientation of the wires can be modified. Additionally, other layers of wires oriented in other directions may be incorporated. Moreover, this invention may be extended to the programming of other types of programmable antifuses which may not be located at the intersection of vertical and horizontal wires (cross antifuses) and may not be electrically connected between the source and drains of pass transistors (pass antifuses). Accordingly, various modifications and adaptations of the specifically described embodiments are to be considered with the spirit and scope of the claimed invention as set forth in the appended claims.

I claim:

1. In a programmable device, a method for reducing a resistance between a first portion of an antifuse to be programmed and a conductor carrying a first programming voltage, comprising the steps of:

establishing a first conductive programming branch from a source of said first programming voltage to said first portion of said antifuse to be programmed; and establishing a second conductive programming branch from a source of said first programming voltage to a location on said first conductive programming branch, said location being spaced from said first portion of said antifuse to be programmed, said location on said first conductive programming branch being occupied at least partially by an antifuse which has already been at least partially programmed.

2. The method of claim 1, wherein said antifuse which is at least partially programmed is a cross antifuse.

3. The method of claim 1, wherein said first conductive programming branch comprises a first wiring segment, a first transistor, a second wiring segment, a second transistor, and a third wiring segment, said first wiring segment, said first transistor, said second wiring segment, said second transistor and said third wiring segment being electrically coupled together in series to form at least a part of said first conductive programming branch, said first transistor being coupled between said first wiring segment and said second wiring segment, said second transistor being coupled between said second wiring segment and said third wiring segment, said location on said first conductive programming branch being a location on said second wiring segment, and wherein said second conductive programming branch comprises a first wiring segment, a first transistor, and a second wiring segment, said first wiring segment, said first transistor and said second wiring segment of said second conductive programming branch being coupled together in series to form at least a part of said second conductive programming branch, said first transistor of said second conductive programming branch being coupled between said first wiring segment of said second conductive programming branch and said second wiring segment of said second conductive programming 4. The method of claim 3, wherein each of said first and second transistors of said first conductive programming branch is controllable to be nonconductive, and wherein said first transistor of said second conductive programming branch is controllable to be nonconductive.

5. The method of claim 4, wherein said wiring segments of said first conductive programming branch are disposed in a first routing track, said first routing track extending in a first direction, and wherein said wiring segments of said second conductive programming branch are disposed in a second routing track, said second routing track extending in a second direction, said first direction being substantially perpendicular to said second direction.

6. In a programmable device, a method for reducing a resistance between a first portion of an antifuse to be programmed and a conductor carrying a first programming voltage, comprising the steps of:
   establishing a first conductive programming branch from a source of said first programming voltage to said first portion of said antifuse to be programmed; and
   establishing a second conductive programming branch from a source of said first programming voltage to a location on said first conductive programming branch, said location being spaced from said first portion of said antifuse to be programmed; and
   establishing a third conductive programming branch from a second portion of said antifuse to be programmed to a source of a second programming voltage, said first conductive programming branch being substantially insulated from said third conductive programming branch before said antifuse to be programmed is programmed, said first conductive programming branch being substantially electrically connected to said third conductive programming branch after said antifuse to be programmed is programmed.

7. The method of claim 6, further comprising the step of:
   establishing a fourth conductive programming branch from a second source of said second programming voltage to a location on said third conductive programming branch, said location being spaced from said second portion of said antifuse to be programmed.

8. In a programmable device, a method for reducing a resistance between a first portion of an antifuse to be programmed and a conductor carrying a first programming voltage, comprising the steps of:
   establishing a first conductive programming branch from a source of said first programming voltage to said first conductive programming branch being a first programming voltage driver; and
   establishing a second conductive programming branch from a source of said first programming voltage to a location on said first conductive programming branch, said location being spaced from said first portion of said antifuse to be programmed, said source of said first programming voltage of said second conductive programming branch being a second programming voltage driver.

9. In a programmable device, a method for reducing a resistance between a first portion of an antifuse to be programmed and a conductor carrying a first programming voltage, comprising the steps of:
   establishing a first conductive programming branch from a source of said first programming voltage to said first portion of said antifuse to be programmed; and
   establishing a second conductive programming branch from a source of said first programming voltage to a location on said first conductive programming branch, said location being spaced from said first portion of said antifuse to be programmed, wherein said antifuse to be programmed is a pass antifuse.

10. In a programmable device, a method for reducing a resistance between a first portion of an antifuse to be programmed and a conductor carrying a first programming voltage, comprising the steps of:
    establishing a first conductive programming branch from a source of said first programming voltage to said first portion of said antifuse to be programmed, at least a portion of said first conductive programming branch being disposed on a first circuit layer of said programmable device; and
    establishing a second conductive programming branch from a source of said first programming voltage to a location on said first conductive programming branch, said location being spaced from said first portion of said antifuse to be programmed, at least a portion of said second conductive programming branch being disposed on a second circuit layer of said programmable device.

11. A method for at least partially programming a first antifuse, comprising the steps of:
    establishing a first conductive branch from a first source of a first voltage to a first antifuse; and establishing a second conductive branch from a second source of said first voltage to a second antifuse, said second antifuse electrically contacting said first conductive branch, said second antifuse being a cross antifuse which is already at least partially programmed.

12. A method of realizing a user-specific circuit in a field programmable gate array chip, said user-specific circuit receiving a plurality of off-chip input electrical signals during normal operation and outputting a plurality of off-chip output electrical signals based on said off-chip input electrical signals during normal operation, said user-specific circuit comprising a plurality of digital logic components and a plurality of interconnection nets, each of said nets of said userspecific circuit being switchable during normal operation to determine said off-chip output electrical signals based on said off-chip input electrical signals, comprising the step of:

programming a programming-access antifuse during a programming operation and before said normal operation, said programming of said programming-access antifuse establishing a programming branch extending from a programming driver to one of said plurality of nets through said programming-access antifuse during antifuse programming, no output terminal of any of said plurality of digital logic components of said user-specific circuit being electrically connected during normal operation to said one net through said programming-access antifuse.

13. The method of claim 12, wherein no input of any of said plurality of digital logic components of said user-specific circuit is electrically connected during normal operation to said one net through said programming-access antifuse.

14. A method of connecting a programming branch to a net of a user-specific circuit realized in a field programmable device, comprising the step of:

programming a programming-access antifuse so that said programming branch is electrically connected to said net via said programming-access antifuse during antifuse programming.

15. In a programmable device comprising:

a first conductive programming branch from a source of a first programming voltage to a first portion of an antifuse to be programmed; and a second conductive programming branch from a source of said first programming voltage to a location on said first conductive programming branch, said location being spaced from said first portion of said antifuse to be programmed, said second conductive programming branch being connected to said first conductive programming branch via a programming-access antifuse, said programming-access antifuse being spaced from said first portion of said antifuse to be programmed.

16. In a programmable device, a method for reducing a resistance from an antifuse to be programmed to a first programming voltage, comprising the steps of:

establishing a first conductive programming branch from a first source of said first programming voltage to said antifuse; and establishing a second conductive programming branch from a second source of said first programming voltage to said first conductive programming branch, said second conductive programming branch not contacting said antifuse to be programmed, said second conductive programming branch not contacting said first source of said first programmed voltage.

* * * * *